US007870515B2

(12) United States Patent
Shephard, III et al.

(10) Patent No.: US 7,870,515 B2
(45) Date of Patent: Jan. 11, 2011

(54) SYSTEM AND METHOD FOR IMPROVED HIERARCHICAL ANALYSIS OF ELECTRONIC CIRCUITS

(75) Inventors: Philip G. Shephard, III, Round Rock, TX (US); Ravichander Ledalla, Fishkill, NY (US); Vasant Rao, Fishkill, NY (US); Jeffrey P. Soreff, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 11/972,923

(22) Filed: Jan. 11, 2008

(65) Prior Publication Data

US 2009/0183130 A1 Jul. 16, 2009

(51) Int. Cl.
*G06F 17/50* (2006.01)
(52) U.S. Cl. .................. 716/2; 716/4; 716/7; 703/16
(58) Field of Classification Search ................ 716/2, 716/4, 7; 703/14
See application file for complete search history.

(56) References Cited

U.S. PATENT DOCUMENTS

| 5,703,798 | A | 12/1997 | Dhar |
| 5,923,569 | A | 7/1999 | Kumashiro et al. |
| 6,044,214 | A | 3/2000 | Kimura et al. |
| 6,301,692 | B1 | 10/2001 | Kumashiro et al. |
| 6,408,265 | B1 | 6/2002 | Schultz et al. |
| 6,564,355 | B1 | 5/2003 | Smith et al. |
| 7,013,440 | B2 | 3/2006 | Croix |
| 7,117,461 | B1 | 10/2006 | Srinivasan |

FOREIGN PATENT DOCUMENTS

| JP | 05028219 A2 | 2/1993 |
| JP | 09114875 A2 | 5/1997 |
| JP | 2000353184 A2 | 12/2000 |

OTHER PUBLICATIONS

Shinichi et al., automated English translation of Japanese Patent Application Publication No. 09-114875, published Feb. 5, 1997, automatically translated on May 9, 2010 at Japan Patent Office website http://www.ipdl.inpit.go.jp/homepg_e.ipdl.*
Andreas Kuehlmann et al., "Verity—a Formal Verification Program for Custom CMOS Circuits", IBM Journal on Research and Development, Jan. 1995, IBM Thomas J. Watson Research Center, Yorktown Heights, N.Y., pp. 1-28.

* cited by examiner

*Primary Examiner*—Phallaka Kik
(74) *Attorney, Agent, or Firm*—The Caldwell Firm, LLC; Patrick E. Caldwell, Esq.

(57) ABSTRACT

A method for hierarchical analysis of electronic circuits comprises selecting a first one of a plurality of abstraction levels of a general design model (GDM). The GDM comprises a first design description of electronic circuits at a plurality of abstraction levels and a plurality of foci, organized into sub-blocks. The method selects a first focus of the plurality of foci to select a first sub-block. The method identifies incomplete electronic circuits in the selected first sub-block. The method generates a second design description of the first sub-block to exclude identified incomplete electronic circuits, wherein the second design description is suitable for electronic design analysis (EDA). The method stores the generated second design description for subsequent use. Subsequent iterations thereby include all components of circuits that were incomplete in prior iterations.

21 Claims, 7 Drawing Sheets

FIG. 1

(PRIOR ART)

SYSTEM AND METHOD FOR IMPROVED HIERARCHICAL ANALYSIS OF ELECTRONIC CIRCUITS

TECHNICAL FIELD

The present invention relates generally to the field of electronic and computer design, especially VLSI design and, more particularly, to a system and method for hierarchical analysis of electronic circuits.

BACKGROUND OF THE INVENTION

Modern electronic devices often include Very Large Scale Integration (VLSI) integrated circuits. Analysis and testing of a particular VLSI design typically includes partitioning the design into a hierarchy of sub-blocks, with each sub-block described at a variety of levels of abstraction. For example, one sub-block might include a number of transistors, organized into logic gates, with the logic gates organized to perform a particular function. Using modern Electronics Design Automation (EDA) tools, this example sub-block can be examined and tested at the transistor level, the logic gate level, and/or the functional level, for example. Further, certain performance analyses combine numerous descriptions of different sub-blocks at the functional level to examine to performance of the entire chip, or, for example, yet another sub-block, examined at the logic gate level. Varying levels of abstraction in VLSI design and analysis is well-known in the art.

However, there are cases where the boundaries between sub-blocks become problematic. For example, a boundary that is desirable with respect to physical components (e.g., transistors) can cause undesirable boundaries at higher levels of abstraction. One common instance of this problem occurs with respect to channel-connected components (CCCs). Generally, a CCC is a set of transistors and nets or nodes formed by traversing the source-drain connections of transistors within the component. Frequently, a desirable transistor layout results in a CCC that spreads across one or more logical boundaries, such that the logical boundaries contain an incomplete CCC circuit.

But many EDA tools require complete circuits to provide meaningful analysis of the sub-blocks. In fact, this need for complete circuits applies to timing analysis, electromigration analysis, noise analysis, transistor level tuning, transistor level circuit checking, generation of gate equivalent logic models for transistor circuits, and other common design and analysis tasks. There are currently no satisfactory solutions to the question of how to incorporate incomplete circuits, especially CCCs, in EDA analysis, although there are some approaches that seek to work around the problem.

For example, one known technique is to repartition the design such that all the devices that make up a circuit are in the same sub-block. This approach suffers from the significant drawback that the sub-block is thus optimized for circuit completeness, which is not necessarily the optimal performance configuration, especially for VLSI designs. While this approach allows for easier analysis, the resultant circuit design may be non-optimal.

Another technique involves performing the analysis at a high enough level in the design hierarchy such that there are no incomplete circuits in the analyzed block boundary. That is, more and more components are added to the analysis block, until a preliminary assessment shows that there are no incomplete circuits in the analysis block. This technique, however, can add substantial analysis steps that far outweigh any benefit of the analysis itself. Further, in some cases the resultant block may contain so many components that it exceeds the capacity of the EDA tool to analyze the block, rendering the technique completely ineffective. Additionally, this technique makes analysis of lower abstraction levels with incomplete circuits, impossible.

Still another known technique includes estimating minimum and maximum loads at the pass transistor inputs of an incomplete CCC, as for example, in the Kumashiro approach, as described in U.S. Pat. No. 6,301,692 to Kumashiro, et al. The Kumashiro approach obtains minimum and maximum capacity values, in advance of analysis, for all the states for an input pin of each gate, and uses the capacity values to find minimum and maximum gate delay values. Given the pre-obtained gate delays, the Kumashiro analysis determines whether given timing conditions are satisfied by static timing analysis. But the Kumashiro approach suffers from, among other disadvantages, the disadvantage that it must assume independent worst-case logic states at each of the separate partial CCCs, leading to an overly pessimistic overall analysis. Further, the Kumashiro approach requires additional computation and estimation, increasing the cost and complexity of the circuit design process.

Figure 1:
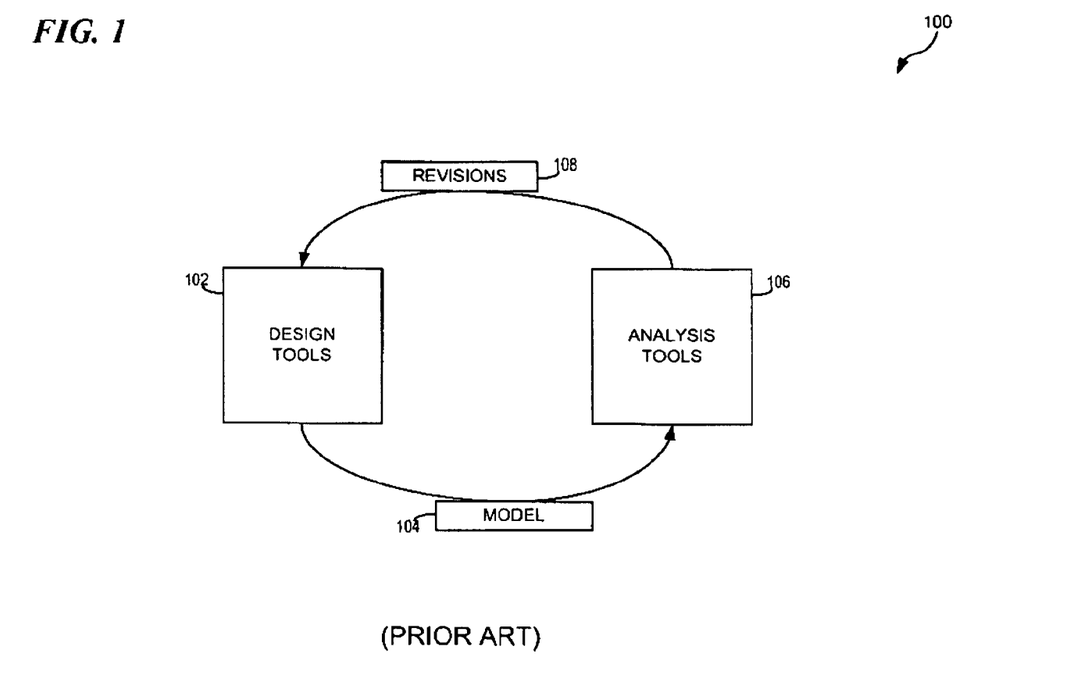
FIG. 1 illustrates a block diagram showing a circuit design and testing methodology in accordance with the Prior Art.

Generally, all of the known approaches follow a similar development paradigm, shown in the exemplary methodology of FIG. 1. FIG. 1 is a high-level block diagram illustrating certain components of a system 100 for circuit design and testing, in accordance with a prior art methodology. System 100 includes design tools 102, which are conventional design tools used to build a model 104 of an electronic circuit.

Design tools 102 generate circuit model 104 in a format suitable for analysis tools 106. Analysis tools 106 analyze model 104 and generate revisions 108 based on the analysis. For example, analysis tools 106 can receive a netlist-format model 104, and return revisions 108 that include "errata" and an "abstraction" describing the behavior of the circuit modeled in model 104.

The design engineer can use revisions 108 in conjunction with design tools 102 to generate a revised model 104, which is then subject to analysis, and so forth, until the circuit design process is complete. One skilled in the art will understand that this methodology is a common approach to electronic design analysis (EDA). This approach, however, suffers from the disadvantages noted above with respect to the systems that follow it.

Therefore, there is a need for a system and/or method for hierarchical analysis of electronic circuits that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved method for hierarchical analysis of electronic circuits.

It is a further aspect of the present invention to provide for an improved a system for hierarchical analysis of electronic circuits.

It is a further aspect of the present invention to provide for an improved method for hierarchical analysis of channel-connected components.

It is a further aspect of the present invention to provide for an improved system for hierarchical analysis of channel-connected components.

The aforementioned aspects and other objectives and advantages can now be achieved as described herein. A method for hierarchical analysis of electronic circuits comprises selecting a first one of a plurality of abstraction levels of a general design model (GDM). The GDM comprises a first design description of electronic circuits at a plurality of abstraction levels and a plurality of foci, organized into sub-blocks. The method selects a first focus of the plurality of foci to select a first sub-block. The method identifies incomplete electronic circuits in the selected first sub-block. The method generates a second design description of the first sub-block to exclude identified incomplete electronic circuits, wherein the second design description is suitable for electronic design analysis (EDA). The method stores the generated second design description for subsequent use. Subsequent iterations thereby include all components of circuits that were incomplete in prior iterations.

The following description also shows several embodiments. The method further performs electronic design analysis (EDA) on the stored design description. The method further generates a design rule describing the sub-block based on the EDA and the identified incomplete circuits. The method further modifies the GDM to include the design rule. The method further stores the modified GDM for subsequent use.

In a particular embodiment, the method further selects a second abstraction level of the modified GDM. The method selects a second focus of the modified GDM to select a second sub-block. The method identifies incomplete electronic circuits in the second sub-block. The method generates a third design description of the second sub-block to exclude identified incomplete electronic circuits in the second sub-block, wherein the third design description is suitable for EDA. The method stores the generated third design description for subsequent use.

In some embodiments, the second abstraction level is higher than the first abstraction level, the first sub-block comprises an incomplete circuit that is complete in the second sub-block, and/or the second sub-block comprises the first sub-block at a higher abstraction level. In some embodiments, the incomplete electronic circuit comprises a channel-connected component (CCC).

In an alternate embodiment, a system comprises an input module adapted to receive a General Design Model (GDM), wherein the GDM comprises a plurality of channel-connected components (CCCs). An abstraction module couples to the input module and is adapted to identify a first selected abstraction level of the GDM. A focus module couples to the abstraction module and is adapted to identify a first selected focus at the first selected abstraction level, thereby selecting a first sub-block. An incomplete circuit module couples to the focus module and is adapted to identify incomplete electronic circuits in the first sub-block. A design description module couples to the incomplete circuit module and is adapted to generate a first design description for the first sub-block to exclude identified incomplete circuits.

An output module couples to the design description module and is adapted to transmit the first design description to an electronic design analysis (EDA) tool for analysis. The input module is further adapted to receive analysis results from an EDA tool. An analysis module couples to the input module, the incomplete circuit module, and the design description module and is adapted to generate a design rule describing the sub-block based on EDA analysis and the identified incomplete circuits. The output module is further adapted to transmit the design rule to design tools adapted to revise the GDM based on the design rule. A design edit module couples to the analysis module and is adapted to modify the GDM based on the design rule.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus or otherwise tangible medium that can contain, store, communicate, propagate, or transport the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W) and DVD.

Figure 6:
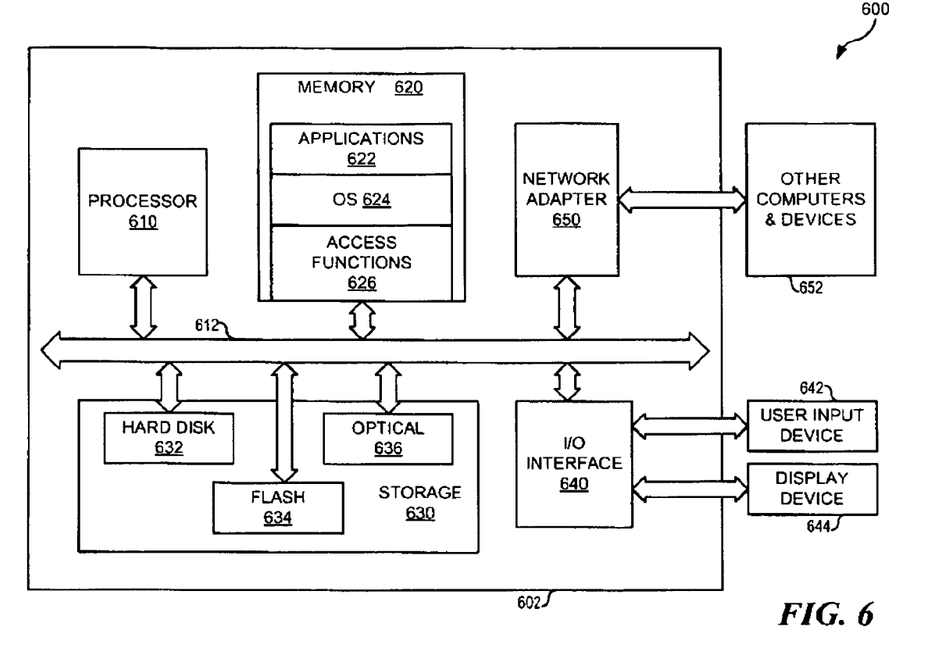
FIG. 6 illustrates a block diagram showing an exemplary computer system, which can be configured to incorporate one or more preferred embodiments.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. FIG. 6, described in more detail below, provides further illustration of an exemplary data processing system, organized as a general computing system.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 2:
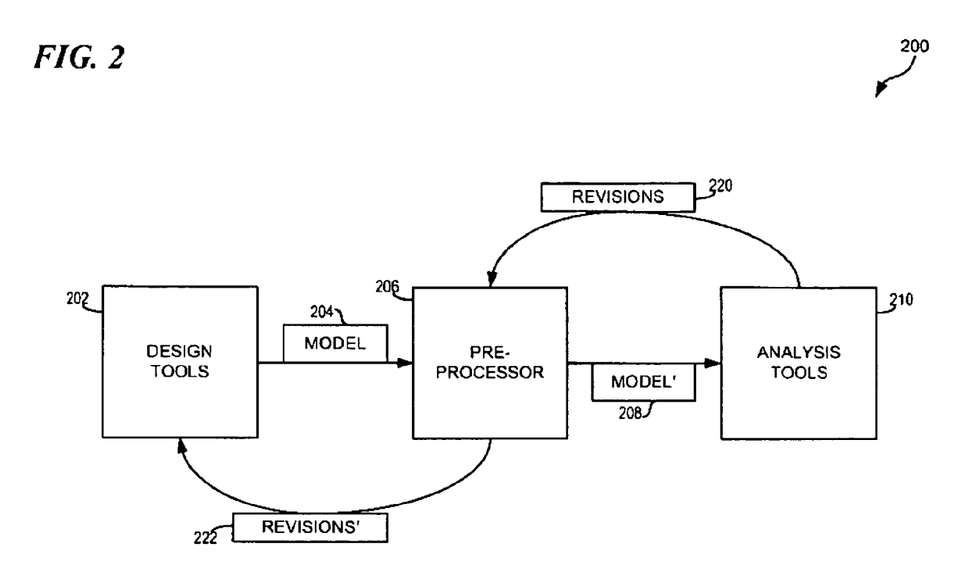
FIG. 2 illustrates a block diagram showing an improved circuit design and testing methodology incorporating one or more preferred embodiments of the present invention.

Referring now to the drawings, FIG. 2 is a high-level block diagram illustrating certain components of a system 200 for circuit design and testing, in accordance with a preferred embodiment of the present invention. System 200 includes design tools 202. Design tools 202 are otherwise conventional design tools adapted or configured for use by a design engineer or other user to build a model 204. One skilled in the art will understand that typical design tools 202 include computer software configured to generate a model 204 of an electronic circuit or circuits. Model 204 is an otherwise conventional electronic circuit model configured in a format suitable for electronic design analysis (EDA) tools.

System 200 also includes preprocessor 206, described in more detail below. Generally, preprocessor 206 receives model 204 and operates on model 204 to generate a revised model 208. As described in more detail below, model 208 is an otherwise conventional electronic circuit model configured in a format suitable for EDA tools, particularly analysis tools, but not including incompletely described circuits.

System 200 also includes analysis tools 210. Analysis tools 210 are otherwise conventional electronic design analysis tools, and are generally configured to analyze model 208 and generate revisions 220 based on the analysis. As is typical for EDA tools, analysis tools 210 return otherwise conventional revisions 220, which, in some embodiments, includes a netlist and an errata sheet.

Preprocessor 206 receives revisions 220 from the analysis tools 210. As described in more detail below, preprocessor 206 operates on revisions 220 to generate revisions 222. Generally, revisions 222 are configured in a format suitable for typical EDA design tools, including design tools 202. As described in more detail below, the design and analysis methodology of system 200 provides numerous advantages over prior systems and methods. For example, one advantage system 200 provides is facilitating analysis of sub-blocks of an electronic circuit design that contain incomplete circuits, especially CCCs.

Figure 3A:
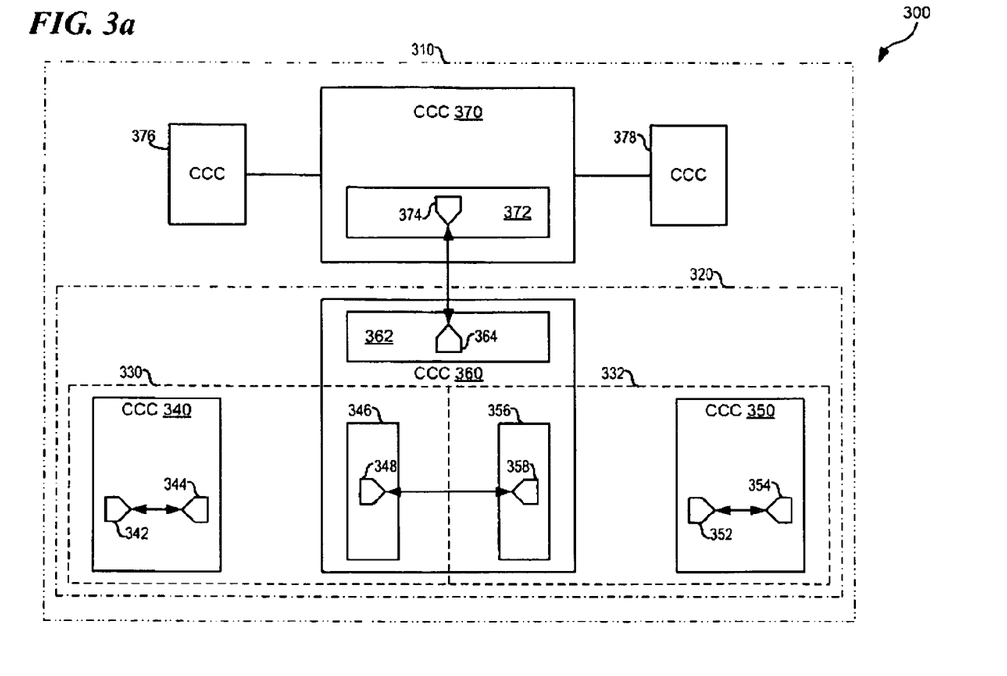
FIG. 3a illustrates a block diagram showing an exemplary circuit design simplified to illustrate one or more preferred embodiments of the present invention.

FIG. 3a is a block diagram illustrating a design 300 comprising various sub-blocks at varying levels of abstraction and focus, some of which contain incomplete electronic circuits. For ease of illustration, the incomplete electronic circuits are described herein with respect to CCCs. One skilled in the art will understand that the process can easily be extended to include other types of circuit groupings found in typical circuit designs.

Design 300 includes sub-block 310, which is shown at a particular level of abstraction. One skilled in the art will understand that the boundaries for each sub-block can be selected from among a variety of methods, and that the design engineer typically chooses sub-block boundaries that facilitate subsequent analysis. As illustrated, sub-block 310 includes all of the components of design 300. Sub-block 310 includes CCCs 370, 376, and 378. Sub-block 310 also includes sub-block 320, which is also shown at a particular level of abstraction. Similarly, sub-block 320 includes sub-block 330 and sub-block 332, which are also shown at a particular level of abstraction.

Generally, as used herein, a "level of abstraction" means the level of detail describing a particular electronic circuit, such as, for example, the behavioral level, gate level, or transistor level. Generally, as used herein, a "focus" means a particular combination of electronic circuits, whether described, in whole or in part, in a behavioral model, gate level model, and/or transistor level model.

As illustrated, each of sub-block 330 and sub-block 332 include both a complete CCC and part of a CCC that is incomplete with respect to that sub-block. For example, sub-block 330 includes a complete CCC 340. As shown, CCC 340 includes illustrative gates gate 342 and gate 344, both of which are completely within the boundaries of sub block 330. Sub-block 330 also includes a portion of an incomplete CCC, indicated as block 346, and including gate 348.

Similarly, sub-block 332 includes a complete CCC 350. As shown, CCC 350 includes gate 352 and gate 354, both of which are completely within the boundaries of sub block 332. Sub-block 332 also includes a portion of an incomplete CCC, indicated as block 356, and including gate 358. As described above, typical EDA tools cannot adequately account for the incomplete components of sub-blocks 300 and 332. Instead, the industry has developed various overly-complicated systems and methods to estimate the design effect represented by the incomplete blocks 346 and 356.

The unique embodiments described herein, however, advantageously compartmentalize the analysis of these incomplete circuits until they are complete, typically in a larger sub-block or a higher level of abstraction. For example, as illustrated, sub-block 320 includes both sub-block 330 and sub-block 332, as well as CCC 360. CCC 360 includes block 346 of sub-block 330 and block 356 of sub-block 332. One skilled in the art will understand that because both gates 348 and 358 are included in CCC 360 at the indicated focus and level of abstraction, the circuit bounded by gates 348 and 358 can be abstracted in a complete behavioral description in the assessment of sub-block 320.

Similarly, CCC 360 includes part of another CCC, which is incomplete in sub-block 320. Specifically, CCC 360 includes block 362, which includes gate 364. As shown, gate 364 couples to gate 374 of block 372, which is a part of CCC 370. While the circuit bounded by 364 and 374 is incomplete with respect to sub-block 320, that circuit is complete with respect to sub-block 310.

Accordingly, as described in additional detail below, the preprocessor and method described herein revises the model describing sub-block 320, received from the design tools, to remove the description of block 362 from the model sent to the analysis tools. One skilled in the art will understand that this approach does not require the design engineer to repartition the design model into a non-optimal sub blocks that do not contain incomplete circuits at the sub-block boundaries. Nor does this approach require overly complicated calculations to estimate the behavior of incomplete circuits at the sub-block boundary. As such, this approach provides significant advantages over current design and analysis techniques, but can be seamlessly integrated with current design and analysis tools.

Additionally, the embodiments described herein receive the results of testing and analysis, "revisions," which include an abstraction or behavioral model of the circuits in the design model or design description submitted to the analysis and testing tools. In one embodiment the revisions comprise a netlist and an errata sheet. The novel preprocessor and method described herein incorporates the revisions into the design model received from the design tools and returns to the design tools a revised model that includes the revisions from the testing and analysis tools. The revised model returned to the design tools includes information about the internal circuits that is needed for analysis of one or more other sub-blocks in the design, such as, for example, a larger sub-block that incorporates the sub-block under consideration.

Figure 3B:
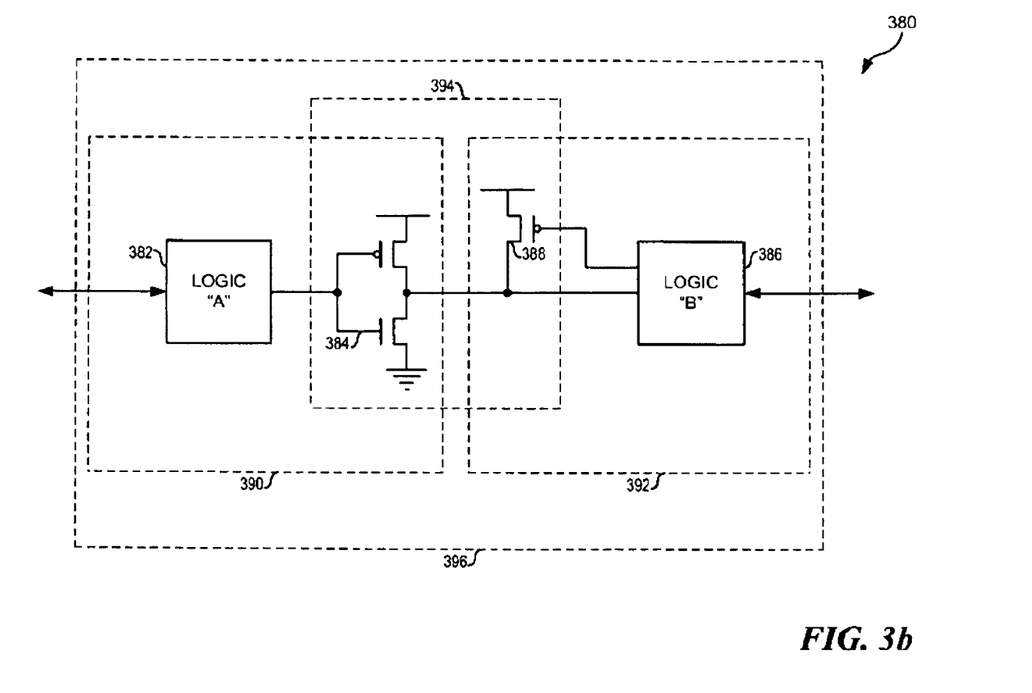
FIG. 3b illustrates a block diagram showing an exemplary circuit design simplified to illustrate one or more preferred embodiments of the present invention.

FIG. 3b is a block diagram illustrating a design 380 comprising a variety of electronic circuit components. More particularly, the arrangement of components of design 380 illustrates the advantages of the embodiments disclosed herein. Design 380 includes an exemplary logic block "A" 382 coupled to a pair of conventional transistors configured as a conventional CMOS inverter 384. Logic block 382 and inverter 384 form a logical sub-block 390. Design 380 also includes an exemplary logic block "B" 386 coupled to a conventional transistor 388. Logic block 386 and transistor 388 for a logical sub-block 392. Logic blocks 382 and 386 are exemplary logic blocks presented to illustrate generic components found in an ordinary VLSI design. Logical sub-block 390 and logical sub-block 392 together form logical sub-block 396.

Inverter 384 couples to transistor 388. Configured as illustrated, one skilled in the art will understand that by traversing the source-to-drain connection between these two components, inverter 384 and transistor 388 together form a CCC, designated as CCC 394. However, as described above inverter 384 and transistor 388 are part of different logical sub-blocks.

One skilled in the art will understand that, in one embodiment, a meaningful behavioral analysis of design 380 tests the behavior of the logical sub-blocks 390 and 392 individually. But, as described above, typical EDA tools require complete CCC electronic circuits for analysis. Because logical sub-blocks 390 and 392 bisect CCC 394, analyzing sub-blocks 390 and 392 would present problems for typical EDA tools, as described above.

The embodiments disclose herein, however, overcome these problems. As described in more detail below, the embodiments disclosed herein identify the components that make up an incomplete CCC for a given level of abstraction and selected focus, that is, a logical sub-block. As shown, inverter 384 is part of an "incomplete CCC" of sub-block 390 and transistor 388 is part of an incomplete CCC of sub-block 392.

The embodiments disclosed herein generate sub-block design descriptions that exclude incomplete CCC components from analysis until the CCC is complete in the selected sub-block. For example, in one embodiment, the present invention excludes inverter 384 from the sub-block design description used for analysis of sub-block 390, deferring analysis of inverter 384 until both inverter 384 and transistor 388 are both in the same selected sub-block for analysis. The present invention likewise excludes transistor 388 from the sub-block design description used for analysis of sub-block 392.

In one embodiment, the present invention instead generates design rules that describe the analyzed components (e.g., logic block 382 of sub-block 390) and identify the components excluded from the analysis (e.g., inverter 384 of sub-block 390). Subsequently, the present invention analyses CCC 394 as part of sub-block 396, when the selected level of abstraction and selected focus select sub-block 396 as the sub-block selected for analysis. More specifically, the present invention uses the design rules from earlier analysis of sub-blocks 390 and 392, which each include fragments of CCC 394. When sub-blocks 390 and 392 are analyzed together as sub-block 396, however, CCC 394 is complete, and is at that point included in a design description of sub-block 396 suitable for EDA analysis. Particular embodiments are described in more detail below.

Figure 4:
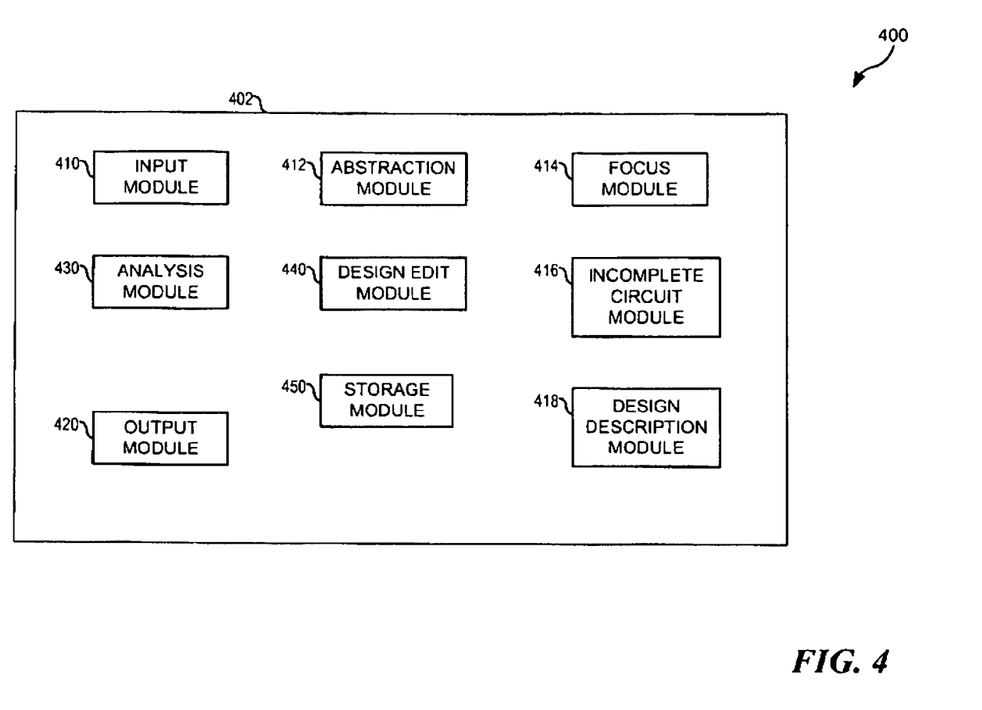
FIG. 4 illustrates a block diagram showing a processor in accordance with a preferred embodiment.

FIG. 4 is a block diagram illustrating a system 400 that includes a preprocessor 402 configured in accordance with one or more embodiments of the present invention. Preprocessor 402 includes input module 410. Input module 410 is configured to receive a general design model (GDM) from conventional design tools. As used herein, a "GDM" is an otherwise conventional design model describing one more electronic circuits at one or more levels of abstraction and/or focus, and including one or more sub-blocks. In one embodiment, input module 410 is an interface between preprocessor 402 and an otherwise conventional EDA design tool.

Preprocessor 402 also includes abstraction module 412. Abstraction module 412 is configured to identify a selected level of abstraction in the GDM. In an alternate embodiment, abstraction module 412 is configured to select a level of abstraction based on input received from a user. In an alternate embodiment, abstraction module 412 is configured to construct an abstract description of at least a portion of the GDM.

Preprocessor 402 also includes focus module 414. Focus module 414 is configured to identify a selected focus or level of focus in the GDM. In an alternate embodiment, focus module 414 is configured to select a focus based on input received from a user. One skilled in the art will understand that selecting a particular level of abstraction and focus also identifies a particular sub-block.

Preprocessor 402 also includes incomplete circuit module 416. Incomplete circuit module 416 is configured to identify incompletely described circuits in the sub-block defined by the selected level of abstraction and focus. In a preferred embodiment, incomplete circuit module 416 is configured to identify CCCs that are incomplete in the selected sub-block.

Preprocessor 402 also includes design description module 418. Design description module 418 is configured to generate a design description for the selected sub-block to exclude identified incomplete circuits. As described above, the resultant design description is in a suitable format for otherwise conventional testing and analysis tools. In one embodiment, design description module 418 excludes identified incomplete circuits by marking the components of the identified incomplete circuits so that they are not subject to design analysis until they become part of a complete circuit, and does not exclude the components entirely from the design description. As such, to "exclude" can include excluding the identified incomplete circuits from analysis in that design description.

Preprocessor 402 includes output module 420. Output module 420 is configured to send or otherwise transmit the design description to analysis and testing tools for analysis and testing. In one embodiment, analysis and testing tools are external to preprocessor 402 and are otherwise conventional analysis and testing tools such as those currently available on the market.

In an alternate embodiment, preprocessor 402 includes analysis module 430. Analysis module 430 incorporates some or all of one or more analysis and testing tools currently available on the market, and/or is otherwise configured to perform analysis and testing operations as commonly undertaken in conventional electronic circuit design and analysis. Analysis module 430 returns revisions, which include a behavioral description of the circuits described in the design description. In embodiments with external analysis tools, input module 410 is configured to receive revisions from the external analysis tools.

Preprocessor 402 includes design edit module 440. Design edit module 440 is configured to assimilate the revisions from the testing and analysis tools into a design rule describing the sub-block's circuit characteristics at the sub-block boundary. The design rule also includes information about the identified incomplete circuits, which can be used in subsequent analysis of sub-blocks that incorporate the components identified as incomplete with respect to the sub-block under consideration. Output module 420 is configured to send or otherwise transmit the design rule, In an alternate embodiment, design edit module 440 incorporates some or all of one or more EDA design tools currently available on the market, and/or is otherwise configured to perform design operations as commonly undertaken in conventional electronic circuit design and analysis. In such embodiments, design edit module 440 is configured to revise the GDM to incorporate the revisions and design rule into a modified GDM. In embodiments wherein analysis module 430 also incorporates conventional analysis and testing tools, preprocessor 402 can be configured as a stand-alone EDA tool, improved by the novel inventions described herein.

Preprocessor 402 also includes storage module 450. Storage module 450 is an otherwise conventional computer data storage unit. Generally, storage module 450 is configured to store one or more of the GDM, design descriptions, and/or design rules for subsequent use.

Figure 5:
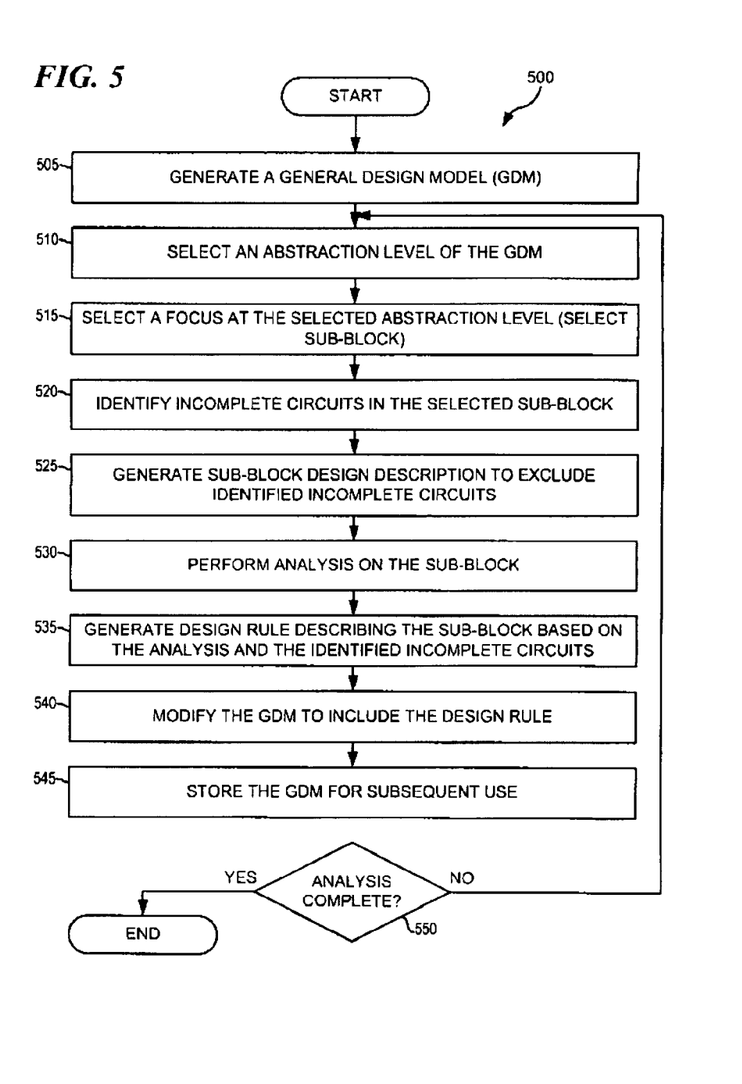
FIG. 5 illustrates a high-level flow diagram depicting logical operational steps of an improved method for hierarchal analysis of electronic circuits, which can be implemented in accordance with a preferred embodiment.

FIG. 5 illustrates one embodiment of a method for hierarchal analysis of electronic circuits. Specifically, FIG. 5 illustrates a high-level flow chart 500 that depicts logical operational steps performed by, for example, system 200 of FIG. 2, which may be implemented in accordance with a preferred embodiment. One skilled in the art will understand that one or more components of the embodiments described herein can perform each step. As such, the following description refers to exemplary components. Generally, a preprocessor, such as preprocessor 206 of FIG. 2 or preprocessor 402 of FIG. 4, performs the steps of the method, unless indicated otherwise.

As indicated at block 505, the process begins, wherein a design engineer, using design tools, such as, for example, design tools 202 of FIG. 2 or design edit module 440 of FIG. 4, creates a general design model (GDM) describing an electronic circuit system comprising one or more sub-blocks. Next, as illustrated at block 510, a user, such as the design engineer, for example, selects a level of abstraction for analysis of the GDM. In an alternate embodiment, the preprocessor, such as abstraction module 412 of FIG. 4, identifies a selected level of abstraction.

Next, as illustrated at block 515, a user, such as the design engineer, for example, selects a focus at the selected level of abstraction, thereby selecting a particular sub-block of the GDM. In an alternate embodiment, the preprocessor, such as focus module 414 of FIG. 4, identifies a selected focus, thereby identifying a selected sub-block.

Next, as illustrated at block 520, the preprocessor, such as incomplete circuit module 416 of FIG. 4, identifies components of the sub-block that are part of circuits not completely contained within the sub-block. Next, the preprocessor, such as design description module 418 of FIG. 4, generates a design description for the sub-block such that the design description does not contain incomplete circuits, and/or such that all of the components included in the design description are part of circuits completely contained within the sub-block.

Next, as illustrated at block 530, testing and analysis tools perform testing and/or analysis of the design description. In one embodiment, external analysis tools, such as analysis tools 210 of FIG. 2, perform the testing and/or analysis. In an alternate embodiment, internal analysis tools, such as analysis module 430 of FIG. 4, perform the testing and/or analysis. In one embodiment, the analysis tools transmit revisions, which include an abstraction of the complete circuits of the sub-block, to the preprocessor.

Next, as illustrated at block 535, the preprocessor, such as design edit module 440 of FIG. 4, generates a design rule describing the sub-block based on the analysis and the identified incomplete circuits. In one embodiment, the design rule describes the circuit characteristics at the sub-block boundary, and includes detailed information about the remaining devices and connections that are part of circuits not completely contained within the sub-block. In one embodiment, the preprocessor also modifies the revisions received from the testing and analysis tools and forwards the modified revisions to design tools for subsequent incorporation into the GDM.

Next, as illustrated at block 540, the design engineer, using design tools such as design tools 202 of FIG. 2, modifies the GDM to incorporate the design rule and, in some embodiments, the modified revisions. In an alternate embodiment, the preprocessor, such as design edit module 440 of FIG. 4, modifies the GDM to incorporate the design rule and, in some embodiments, the modified revisions.

Next, as illustrated at block 545, the preprocessor, such as storage module 450 of FIG. 4, stores one or more of the GDM, the modified GDM, the design description, and/or the design rule for subsequent use. Next, as illustrated at block 550, the design engineer, or, in one embodiment, the preprocessor operating with predetermined constraints, determines whether analysis of the GDM is complete.

If at block 550 the analysis of the GDM is not complete, the process continues along the NO branch, returning to block 510, wherein the design engineer and/or preprocessor selects the next abstraction level to analyze. One skilled in the art will understand that, generally, subsequent analysis of higher levels of abstraction, broader focus, and/or larger sub-blocks incorporates the abstractions of the current sub-block and the identified incomplete circuit components such that when analysis of the GDM is complete, all of the identified incomplete circuit components will be matched with their counterparts and all of the circuits previously identified as incomplete will have been analyzed as complete.

If at block 550 the analysis of the GDM is complete, the process continues along the YES branch and ends.

Thus, generally, systems 200 and 400 provide a mechanism to facilitate analysis of EDA design descriptions that include sub-blocks with incompletely described circuits. Specifically, in one embodiment, systems 200 and 400 defer analysis of incompletely described circuits to higher abstraction levels and/or larger sub-blocks wherein the circuits are completely contained within the sub-block boundary. Systems 200 and 400 process circuits that are completely contained within a sub-block for conventional analysis and abstraction, which reduces the analytical load on the higher abstraction levels and/or larger sub-blocks, in some cases permitting analysis that would otherwise be prohibitively complex.

Accordingly, the disclosed embodiments provide numerous advantages over other methods and systems. For example, the embodiments described herein can be configured to operate with unmodified design tools and EDA tools currently in widespread use. For example, the pre-processor described herein can be configured to couple between a conventional design tools system and a conventional EDA system. As such, the present invention can be implemented in conjunction with existing systems, without also incurring substantial expense to modify the existing design and EDA tools.

Additionally, the embodiments disclosed herein provide an effective solution to the pervasive problem of convenient analysis boundaries causing incomplete circuits within the defined boundaries, particularly with respect to CCCs. This solution is somewhat transparent to the end user, who can continue to use known design tools and EDA tools, without extensive re-training.

Moreover, the embodiments disclosed herein do not require additional monitoring of which circuits are incomplete at any particular abstraction level or focus. Instead, the embodiments described herein defer analysis of circuits that are incomplete at one abstraction level and focus until the complete circuit is contained within a sub-block, without also deferring analysis of circuits that are complete at that abstraction level and focus.

Deferring analysis provides additional benefits in that certain circuits can be advantageously modeled without the constraints necessary in prior art approaches. For example, the embodiments disclosed herein can be configured to exploit CCC-wide information such as "hot1" constraints across multiple legs of a multiplexer. Typical prior art techniques must instead assume worst-case logic states at each of the separate partial CCCs, resulting in less accurate modeling and analysis. As such, the embodiments described herein can help improve accuracy and effectiveness of the analysis tools used in electronic circuit design.

Additionally, the embodiments described herein do not require extensive or speculative calculations or performance estimation. As illustrated above, deferring analysis of partially complete circuits to higher levels of abstraction or larger sub-blocks, without also deferring analysis of complete circuits, reduces the analytical load on the analysis tools. At each sub-block, the analysis tools receive only complete circuits for analysis, and can therefore generate an abstraction of the circuits that are complete, further reducing the analytical load for larger sub-blocks and higher abstraction levels that include the abstracted circuits. Accordingly, no extensive or speculative calculations are necessary for the incomplete circuits, in part because the analysis tools that would otherwise perform such calculation are no longer presented with incomplete circuits.

As described above, one or more embodiments described herein may be practiced or otherwise embodied in a computer system. Generally, the term "computer," as used herein, refers to any automated computing machinery. The term "computer" therefore includes not only general purpose computers such as laptops, personal computers, minicomputers, and mainframes, but also devices such as personal digital assistants (PDAs), network enabled handheld devices, internet or network enabled mobile telephones, and other suitable devices. FIG. 6 is a block diagram providing details illustrating an exemplary computer system employable to practice one or more of the embodiments described herein.

Specifically, FIG. 6 illustrates a computer system 600. Computer system 602 includes computer 602. Computer 602 is an otherwise conventional computer and includes at least one processor 610. Processor 610 is an otherwise conventional computer processor and can comprise a single-core, dual-core, central processing unit (PU), synergistic PU, attached PU, or other suitable processors, as one skilled in the art will understand.

Processor 610 couples to system bus 612. Bus 612 is an otherwise conventional system bus. As illustrated, the various components of computer 602 couple to bus 612. For example, computer 602 also includes memory 620, which couples to processor 610 through bus 612. Memory 620 is an otherwise conventional computer main memory, and can comprise, for example, random access memory (RAM). Generally, memory 620 stores applications 622, an operating system 624, and access functions 626.

Generally, applications 622 are otherwise conventional software program applications, and can comprise any number of typical programs, as well as computer programs incorporating one or more embodiments of the present invention. Operating system 624 is an otherwise conventional operating system, and can include, for example, Unix, AIX, Linux, Microsoft Windows™, MacOS™, and other suitable operating systems. Access functions 626 are otherwise conventional access functions, including networking functions, and can be include in operating system 624.

Computer 602 also includes storage 630. Generally, storage 630 is an otherwise conventional device and/or devices for storing data. As illustrated, storage 630 can comprise a hard disk 632, flash or other volatile memory 634, and/or optical storage devices 636. One skilled in the art will understand that other storage media can also be employed.

An I/O interface 640 also couples to bus 612. I/O interface 640 is an otherwise conventional interface. As illustrated, I/O interface 640 couples to devices external to computer 602. In particular, I/O interface 640 couples to user input device 642 and display device 644. Input device 642 is an otherwise conventional input device and can include, for example, mice, keyboards, numeric keypads, touch sensitive screens, microphones, webcams, and other suitable input devices. Display device 644 is an otherwise conventional display device and can include, for example, monitors, LCD displays, GUI screens, text screens, touch sensitive screens, Braille displays, and other suitable display devices.

A network adapter 650 also couples to bus 612. Network adapter 650 is an otherwise conventional network adapter, and can comprise, for example, a wireless, Ethernet, LAN, WAN, or other suitable adapter. As illustrated, network adapter 650 can couple computer 602 to other computers and devices 652. Other computers and devices 652 are otherwise conventional computers and devices typically employed in a networking environment. One skilled in the art will understand that there are many other networking configurations suitable for computer 602 and computer system 600.

It will be appreciated that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method for hierarchical analysis of electronic circuits, comprising:
    selecting a first one of a plurality of abstraction levels of a general design model (GDM);
    wherein the GDM comprises a first design description of electronic circuits at a plurality of abstraction levels and a plurality of foci, organized into sub-blocks;
    selecting a first focus of the plurality of foci to select a first sub-block;
    identifying incomplete electronic circuits in the selected first sub-block;
    generating, by a computer, a second design description of the first sub-block to exclude identified incomplete electronic circuits, the second design description suitable for electronic design analysis (EDA); and
    storing the generated second design description for subsequent use.

2. The method as recited in claim 1, further comprising performing electronic design analysis (EDA) on the second design description.

3. The method as recited in claim 2, further comprising generating a design rule describing the sub-block based on the EDA and the identified incomplete electronic circuits.

4. The method as recited in claim 3, further comprising modifying the GDM to include the design rule.

5. The method as recited in claim 4, further comprising storing the modified GDM for subsequent use.

6. The method as recited in claim 3, further comprising:
    selecting a second abstraction level of the modified GDM;
    selecting a second focus of the modified GDM to select a second sub-block;
    identifying incomplete electronic circuits in the second sub-block;
    generating a third design description of the second sub-block to exclude identified incomplete electronic circuits in the second sub-block, the third design description suitable for EDA; and
    storing the generated third design description for subsequent use.

7. The method as recited in claim 6, wherein the second abstraction level is higher than the first abstraction level.

8. The method as recited in claim 6, wherein the first sub-block comprises an incomplete electronic circuit that is complete in the second sub-block.

9. The method as recited in claim 6, wherein the second sub-block comprises the first sub-block at a higher abstraction level.

10. The method as recited in claim 1, wherein the incomplete electronic circuit comprises a channel-connected component (CCC).

11. A system, comprising:
    an input module adapted to receive a General Design Model (GDM), the GDM comprising a plurality of channel-connected components (CCCs);
    an abstraction module coupled to the input module and adapted to identify a first selected abstraction level of the GDM;
    a focus module coupled to the abstraction module and adapted to identify a first selected focus at the first selected abstraction level, thereby selecting a first sub-block;
    an incomplete circuit module coupled to the focus module and adapted to identify incomplete electronic circuits in the first sub-block;
    a design description module coupled to the incomplete circuit module and adapted to generate a first design description for the first sub-block to exclude identified incomplete electronic circuits;
    an output module coupled to the design description module and adapted to transmit the first design description to an electronic design analysis (EDA) tool for analysis;
    wherein the input module is further adapted to receive analysis results from an EDA tool;
    an analysis module coupled to the input module, the incomplete circuit module, and the design description module and adapted to generate a design rule describing the sub-block based on EDA analysis and the identified incomplete circuits;
    wherein the output module is further adapted to transmit the design rule to design tools adapted to revise the GDM based on the design rule; and
    a design edit module coupled to the analysis module and adapted to modify the GDM based on the design rule.

12. The system as recited in claim 11, further comprising a storage module coupled to the design description module and the design edit module and adapted to store the design description and the modified GDM for subsequent use.

13. The system as recited in claim 11, further comprising:
    wherein the abstraction module is further adapted to identify a second selected abstraction level of the modified GDM;
    wherein the focus module is further adapted to identify a second selected focus at the second selected abstraction level, thereby selecting a second sub-block;
    wherein the incomplete circuit module is further adapted to identify incomplete electronic circuits in the second sub-block; and
    wherein the design description module is further adapted to generate a second design description for the second sub-block to exclude identified incomplete circuits.

14. The system as recited in claim 13, wherein the second selected abstraction level is higher than the first selected abstraction level, wherein the second sub-block comprises the first sub-block, and wherein the first sub-block comprises an incomplete electronic circuit that is complete in the second sub-block.

15. A computer program product comprising a non-transitory tangible computer useable medium having a computer readable program, wherein the computer readable program when executed on a computer causes the computer to:
    select a first one of a plurality of abstraction levels of a general design model (GDM);
    wherein the GDM comprises a first design description of electronic circuits at a plurality of abstraction levels and a plurality of foci, organized into sub-blocks;
    select a first focus of the plurality of foci to select a first sub-block;

identify incomplete electronic circuits in the selected first sub-block;

generate a second design description of the first sub-block to exclude identified incomplete electronic circuits, the second design description suitable for electronic design analysis (EDA); and store the generated second design description for subsequent use.

16. The computer program product as recited in claim 15, wherein the computer readable program when executed on a computer further causes the computer to perform electronic design analysis (EDA) on the stored second design description.

17. The computer program product as recited in claim 16, wherein the computer readable program when executed on a computer further causes the computer to generate a design rule describing the sub-block based on the EDA and the identified incomplete circuits.

18. The computer program product as recited in claim 17, wherein the computer readable program when executed on a computer further causes the computer to modify the GDM to include the design rule.

19. The computer program product as recited in claim 17, wherein the computer readable program when executed on a computer further causes the computer to:

select a second abstraction level of the modified GDM;

select a second focus of the modified GDM to select a second sub-block;

identify incomplete electronic circuits in the second sub-block;

generate a third design description of the second sub-block to exclude identified incomplete electronic circuits in the second sub-block, the third design description suitable for EDA; and store the generated third design description for subsequent use.

20. The computer program product as recited in claim 19, wherein the second abstraction level is higher than the first abstraction level, and the first sub-block comprises an incomplete circuit that is complete in the second sub-block.

21. The computer program product as recited in claim 19, wherein the second sub-block comprises the first sub-block at a higher abstraction level.

\* \* \* \* \*